(12) United States Patent
Wood (10) Patent No.: US 9,626,853 B2
(45) Date of Patent: Apr. 18, 2017

(54) THERMAL SWITCH

(71) Applicant: Raytheon Company, Waltham, MA (US)

(72) Inventor: Adam C. Wood, Oro Valley, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/796,831

(22) Filed: Jul. 10, 2015

(65) Prior Publication Data

US 2017/0011607 A1    Jan. 12, 2017

(51) Int. Cl.
*G08B 17/06* (2006.01)
*H01H 37/32* (2006.01)
*A62C 37/11* (2006.01)
*H01L 41/08* (2006.01)

(52) U.S. Cl.
CPC ............. *G08B 17/06* (2013.01); *A62C 37/11* (2013.01); *H01H 37/32* (2013.01); *H01L 41/082* (2013.01)

(58) Field of Classification Search
CPC ....... H01L 41/082; F03G 7/005; H05B 3/146; G08B 17/06; A62C 37/11; H01H 37/32

USPC .......... 340/593; 374/178; 219/548; 310/338
See application file for complete search history.

(56) References Cited

U.S. PATENT DOCUMENTS

| | | | | |
|---|---|---|---|---|
| 8,283,612 | B2 * | 10/20 | Kreite-Telgenbuescher | B60R 1/0602 219/529 |
| 8,419,273 | B2 * | 4/2013 | Hadwen ............ | B01L 3/502792 374/112 |
| 8,471,438 | B2 * | 6/2013 | Yamamoto .......... | H01L 41/0825 310/338 |

* cited by examiner

*Primary Examiner* — John A Tweel, Jr.

(57) ABSTRACT

Technology for a thermal switch is described. The thermal switch can include a first conducting layer. The thermal switch can include a second conducting layer. The thermal switch can include a material layer in between the first conducting layer and the second conducting layer. The material layer can be a conductor when above a defined temperature and a dielectric when below the defined temperature. The thermal switch can be operable to close an electrical circuit when the material layer is a conductor and open the electrical circuit when the material layer is the dielectric.

20 Claims, 7 Drawing Sheets

THERMAL SWITCH

BACKGROUND

As is well known, an electrical switch is a device used to interrupt a flow of electrons (or current) in an electrical circuit. One type of switch includes two conductive pieces that are connected to an external circuit. The two conductive pieces (also referred to as contacts) can touch to complete (or make) the circuit, or the two conductive pieces can separate to open (or break) the circuit. In other words, when the contacts are touching, electricity can flow between them and the circuit is closed. When the contacts are separated, the switch is nonconducting (i.e., the circuit is open). A mechanism actuating a transition between these two states (i.e., open or closed) can be either a toggle (e.g., a flip switch for continuous "on" or "off") or momentary (e.g., push-for "on" or push-for "off") type.

The mechanism of the electrical switch can be operated directly by an operator to control the electrical circuit (e.g., a light switch or a keyboard button). In other words, the switch can be directly manipulated by the operator as a control signal to a system, such as a computer keyboard button or to control power flow in a circuit, such as a light switch. Alternatively, the mechanism of the electrical switch can be operated by a sensing element for pressure, temperature, flow, etc. Non-limiting examples of switches include a proximity switch, speed switch, pressure switch, temperature switch, liquid level switch, liquid flow switch, etc.

In traditional temperature switches, a strip of two metals are joined together, wherein each metal has a distinct rate of thermal expansion. When the strip heats up or cools down, differing rates of thermal expansion between the two metals can cause the strip to bend. The bending of the strip can be used to actuate a switch mechanism to open or close an electrical switch. Other temperature switches can use a brass bulb filled with either a liquid or gas. As the bulb is heated, the gas or liquid expands, which generates a pressure increase. The increase in pressure can actuate the switch mechanism.

Traditional temperature switches generally involve discrete point measurements. For example, traditional temperature switches (or discrete point sensors) can be spread across an area in order to detect an over-temperature event (e.g., a fuel fire) in the area. However, the use of these traditional temperature switches often results in a compromise between probability of detection and the cost of a large number of switches. In other words, a likelihood of detecting the over-temperature event in the area increases when the number of switches in the area also increases. However, an increased number of switches can add weight, volume, complexity and cost.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

EXAMPLE EMBODIMENTS

An initial overview of technology embodiments is provided below and then specific technology embodiments are described in further detail later. This initial summary is intended to aid readers in understanding the technology more quickly and is not intended to identify key features or essential features of the technology, nor is it intended to limit the scope of the claimed subject matter.

A technology is described for activating a system via a thermal switch. The thermal switch can be an electrical switch that opens or closes an electrical circuit based on temperature. The system can be activated when the electrical circuit is closed, or alternatively, the system can be inactive when the electrical circuit is open. The thermal switch can include a first conducting layer (e.g., a first conductive plate), a second conducting layer (e.g., a second conductive plate), and a material layer in between the first conducting layer and the second conducting layer. In one example, the material layer can be an ionic liquid (e.g., salt) layer. The material layer can function as a dielectric (or insulator) when below a defined temperature. Alternatively, the material layer can function as a conductor when above the defined temperature. Therefore, when the material layer is heated to above the defined temperature, the material layer conducts electricity (i.e., current can flow through the electrical circuit). As a result, the system can be activated via the thermal switch. Non-limiting examples of the system include a fire mitigation system or an alarm system. When the material layer is cooled down to below the defined temperature, the material layer does not conduct electricity (i.e., the electrical circuit is open). Thus, the system is deactivated because the thermal switch prevents current from flowing through the electrical circuit.

Figure 1A:
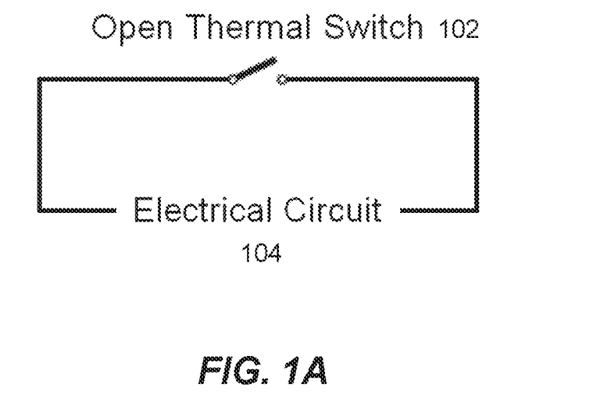
FIG. 1A illustrates a thermal switch that opens an electrical circuit in accordance with an example.

FIG. 1A illustrates an exemplary thermal switch 102 that opens an electrical circuit 104. The thermal switch 102 can open the electrical circuit 104 due to temperature. For example, if a detected temperature is below a defined threshold, the thermal switch 102 can open the electrical circuit 104. In other words, the electrical circuit 104 is open when below a trigger temperature. When the electrical circuit 104 is open, current is not allowed to flow through the electrical circuit 104. Therefore, external systems (not shown in FIG. 1A) can be deactivated when the electrical circuit 104 is open.

Figure 1B:
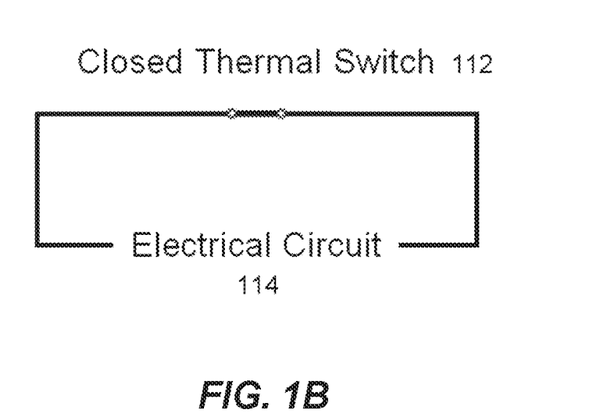
FIG. 1B illustrates a thermal switch that closes an electrical circuit in accordance with an example.

FIG. 1B illustrates an exemplary thermal switch 112 that closes an electrical circuit 114. The thermal switch 112 can close the electrical circuit 114 due to temperature. For example, if a detected temperature is above a defined threshold, the thermal switch 112 can close the electrical circuit 114. In other words, the electrical circuit 114 is closed when above a trigger temperature. When the electrical circuit 114 is closed, current is allowed to flow through the electrical circuit 114. Therefore, external systems (not shown in FIG. 1B) can be activated when the electrical circuit 114 is closed.

Figure 2A:
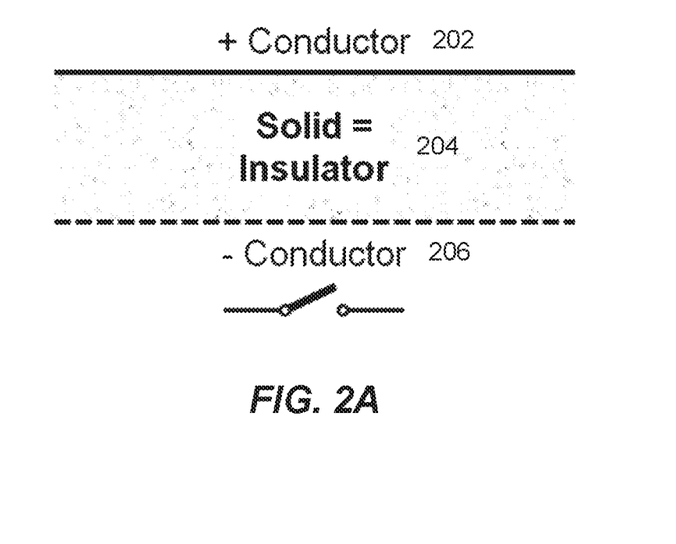
FIG. 2A illustrates a solid material layer that acts as an insulator between a first conducting layer and a second conducting layer in accordance with an example.

FIG. 2A illustrates a solid material layer 204 that acts as an insulator between a first conducting layer 202 and a second conducting layer 206. The first conducting layer 202, the material layer 204, and the second conducting layer 206 can comprise a thermal switch that is connected to an electrical circuit (not shown in FIG. 2A). The first conducting layer 202 and the second conducting layer 206 can include conductive wires or plates (e.g., copper wires or copper plates). The first conducting layer 202 can be a positive conducting layer and the second conducting layer 206 can be a negative conducting layer. The material layer 204 can be an ionic compound, such as a salt. When the material layer 204 is exposed to a temperature that is below a defined threshold, the material layer 204 is solid. In other words, the material layer 204 acts as an insulator (or a dielectric). As explained in further detail below, current does not flow through the first conducting layer 202 and the second conducting layer 206 when the material layer 204 between the two conducting layers is a dielectric. As a result, the electrical circuit is open and an external system connected to the electrical circuit (not shown in FIG. 2A) is deactivated.

Figure 2B:
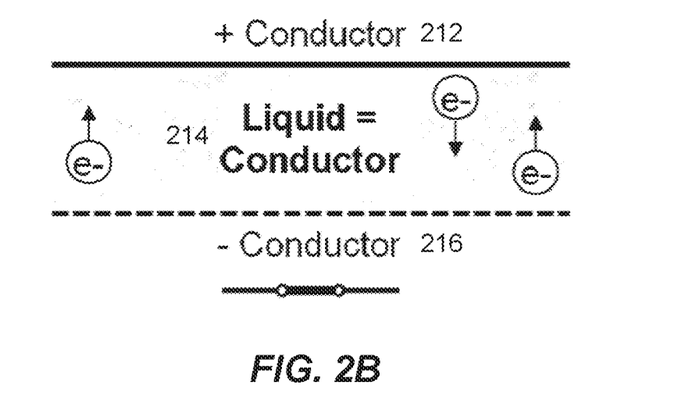
FIG. 2B illustrates a liquid material layer that acts as a conductor between a first conducting layer and a second conducting layer in accordance with an example.

FIG. 2B illustrates a liquid material layer 214 that acts as a conductor between a first conducting layer 212 and a second conducting layer 216. The first conducting layer 212, the material layer 214, and the second conducting layer 216 can comprise a thermal switch that is connected to an electrical circuit (not shown in FIG. 2B). The first conducting layer 212 and the second conducting layer 216 can include conductive wires or plates (e.g., copper wires or copper plates). The first conducting layer 212 can be a positive conducting layer and the second conducting layer 216 can be a negative conducting layer. The material layer 214 can be an ionic compound, such as a salt. When the material layer 214 is exposed to a temperature that is above a defined threshold, the material layer 214 is liquid. In other words, the material layer 214 acts as a conductor. As explained in further detail below, current is allowed to flow through the first conducting layer 212 and the second conducting layer 216 when the material layer 214 between the two conducting layers is a conductor. As a result, the electrical circuit is closed and an external system connected to the electrical circuit (not shown in FIG. 2B) is activated.

Figure 3:
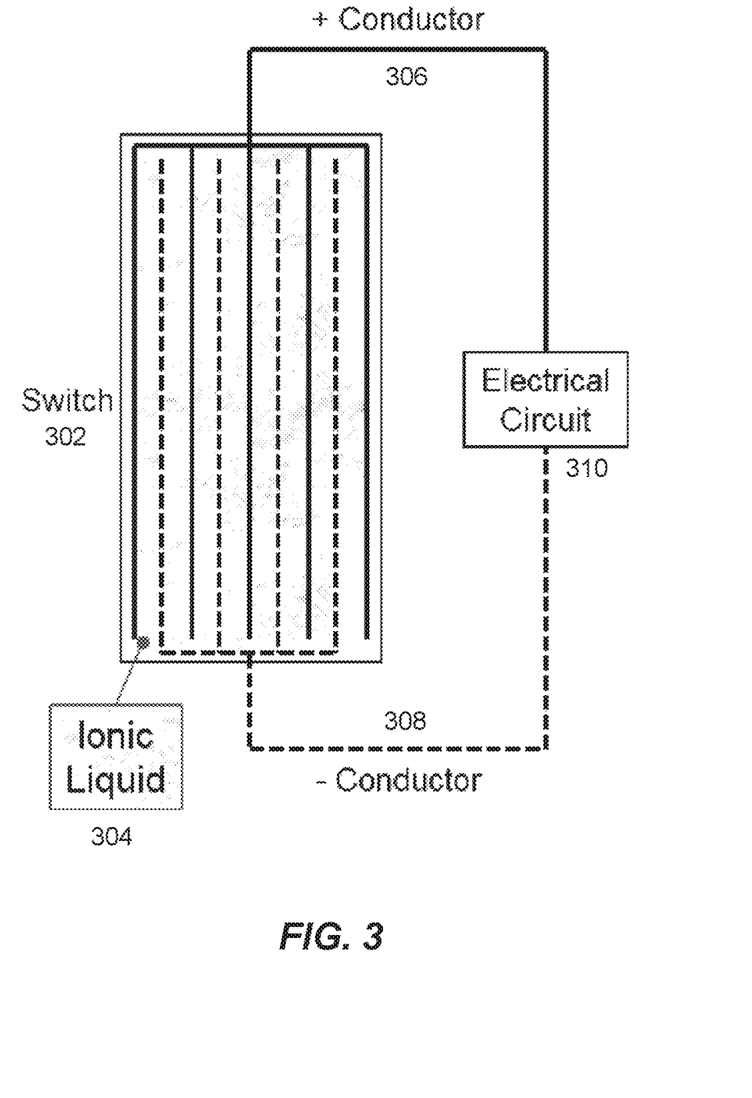
FIG. 3 illustrates a thermal switch operable to control an electrical circuit in accordance with an example.

FIG. 3 illustrates an exemplary thermal switch 302 operable to control an electrical circuit 310. The thermal switch 302 can sense a change in temperature and, in response, open or close the electrical circuit 310. The thermal switch 302 can include a first conducting layer 306 (or a first conductor), a second conducting layer 308 (or a second conductor), and a material layer 304 (e.g., an ionic liquid) in between the first conducting layer and the second conducting layer. In one example, when a temperature at the material layer 304 reaches a defined threshold, the thermal switch 302 can close the electrical circuit 310. In another example, when the temperature at the material layer 304 drops below the defined threshold, the thermal switch 302 can open the electrical circuit 310.

As non-limiting examples, the thermal switch 302 can be onboard a moving platform or vehicle (e.g., a missile) or installed in a building. Based on whether the electrical circuit 310 is open or closed via the thermal switch 302, an external system (not shown in FIG. 3) can be deactivated or activated, respectively. In general, the external system can be a system that is capable of being turned on or turned off. Non-limiting examples of the external system include an alarm system, a fire mitigation system (e.g., a sprinkler system), a heating system, an air conditioning system, a power system, a battery system, etc. Therefore, when the thermal switch 302 closes the electrical circuit 310, the alarm system, fire mitigation system, etc. can be activated. When the thermal switch 302 opens the electrical circuit 310, the alarm system, fire mitigation system, etc. can be deactivated.

In one example, the thermal switch 302 can facilitate fire detection and mitigation. For example, heat from the fire can cause the thermal switch 302 to close the electrical circuit 310, which can activate a system for mitigating the fire.

In one example, the electrical conductors (i.e., the first conducting layer 306 and the second conducting layer 308) in the thermal switch 302 are separated by the material layer 304 (e.g., the ionic liquid). The number of electrical conductors in the thermal switch 302 can be two or more. The material layer 304 can have a defined thickness. The material layer 304 can act as a dielectric (or insulator) between the electrical conductors when the temperature of the material layer 304 is below the defined threshold. In other words, current does not flow between the electrical conductors because the material layer 304 is a solid insulating layer between the electrical conductors. Alternatively, the material layer 304 can act as a conductor when the temperature of the material layer 304 is above the defined threshold. In other words, current is allowed to flow between the electrical conductors because the material layer 304 is a liquid conducting (or conductive) layer between the electrical conductors. The first conducting layer 306 is electrically connected with the second conducting layer 308 when the material layer 304 is in liquid form. When the current does not flow between the electrical conductors, the thermal switch 302 opens the electrical circuit 310, thereby deactivating the external system. When the current is allowed to flow between the electrical conductors, the thermal switch 302 closes the electrical circuit 310, thereby activating the external system.

The first conducting layer 306 and the second conducting layer 308 can include conductive wires or plates. The conductive wires or plates can be composed of, but are not limited to, copper, silver, or aluminum. The conductive wires or plates can be in a wide range of geometric forms.

In one example, a metal rod can be filled with the material layer 304 (e.g., the ionic liquid). The first conducting layer 306 and the second conducting layer 308 can be a defined area (e.g., the conductive layers can have a defined area of two square meters). As a result, the thermal switch 302 can sense changes in temperature over a relatively wide area. In other words, if a particular section of the thermal switch 302 (e.g., a particular section of the thermal switch 302 that covers an area of two square meters) detects that the temperature is above the defined threshold, the thermal switch 302 can close the electrical circuit 310. Therefore, the present technology provides area coverage as opposed to linear or point coverage. In one example, a relatively thin thermal switch can cover an entire area in order to detect temperatures over an entire harness cover or fuselage (e.g., on a missile).

The material layer 304 can be a layer comprised of ionic compounds. An ionic compound is a compound in which ions are held together in a structure by ionic bonds. The positively charged ions are cations and the negative charged ions are anions. In general, ionic compounds are electrically insulating when solid (i.e., do not conduct electricity), but become conductive when melted (i.e., in liquid form) because the ions are mobilized. In one example, the material layer 304 can comprise an ionic liquid, such as a salt in liquid state. The salt (in liquid state) can conduct electricity. Therefore, current can flow between the first conducting layer and the second conducting layer 306 when the material layer 304 is a salt in liquid form. The salt separates anodes and cathodes at room temperature, but when a salt temperature is elevated to a melting point (i.e., when the salt turns into a liquid), electrical contact is initiated between the anodes and the cathodes. Thus, electricity can begin to conduct across the salt when the salt has melted, but when the salt cools down and solidifies, the salt no longer conducts electricity. The electrical circuit 310 is closed when the salt conducts electricity and open when the salt does not conduct electricity.

Since the material layer 304 (e.g., a salt) can melt at a specific temperature, different material layers can yield various melting temperatures. In one configuration, the material layer 304 for the thermal switch 302 can be selected based on a melting temperature associated with the material layer 304. For example, if it is desirable to close the electrical circuit 310 upon detecting a relatively high temperature, then a material layer can be selected that possesses a relatively high melting temperature. Similarly, if it is desirable to open the electrical circuit 310 upon detecting a relatively low temperature, then a material layer can be selected that possesses a relatively low melting temperature. In some examples, the material layer 304 can melt at a relatively low temperature, room temperature, slightly above room temperature, or substantially higher than room temperature. Based on a type of external system that is activated or deactivated, an appropriate type of material layer 304 (e.g., with an appropriate melting temperature) can be selected for the thermal switch 302. Any material exhibiting these properties may be used and this innovation is not limited to ionic salts.

In one configuration, multiple thermal switches can be installed, wherein each thermal switch closes a distinct electrical circuit at a defined temperature level. For example, a first thermal switch can close the electrical circuit at a first temperature, thereby activating an alarm. A second thermal switch can close a separate electrical circuit at a second temperature that is greater than the first temperature, thereby activating a sprinkler system.

In the present technology, the material layer 304 in the thermal switch 302 is capable of transitioning between solid and liquid for an extended period of time. In other words, the material layer 304 is reusable. Previous thermal switch designs can use a melting polymer that, after being melted, is unable to go back to a solid state. When the polymer melts, two wires that conduct electricity combine together, but the two wires cannot be separated when the temperature drops. Therefore, in previous designs, the thermal switch is unable to be used more than once. In contrast, the thermal switch 302 in the present technology can provide multiple use or long-term temperature sensing capability, in addition to one-time use.

As a non-limiting example, the thermal switch 302 can appear as a round-wire or flex harness with copper wires separated by a lower-temperature melting salt (with the salt or other material selected based on a desired activation temperature). When the salt anywhere along the length of the harness has melted, the electrical circuit 310 would be closed and the external system would activate. Such a design can be relatively flat and made as wide as desired by using multiple wires. Another design can use conducting plates separated by the ionic liquid.

As a non-limiting example, the thermal switch 302 can be installed in a building. The thermal switch 302 can comprise a rectangular area that surrounds machinery in the building. The thermal switch 302 can be protected via an enclosure (e.g., steel or concrete housing that surrounds the thermal switch 302). The thermal switch 302 can include the first conducting layer 306, the second conducting layer 308, and the material layer 304 in between the first conducting layer 306 and the second conducting layer 308. If a fire were to break out in the building, the thermal switch 302 can detect changes in temperature within the building. In particular, if the heat of the fire were to cause the material layer 304 to turn into liquid (e.g., the temperature of the material layer 304 exceeds a defined threshold), then the thermal switch 302 can close the electrical circuit 310. In other words, the material layer 304 (when in liquid form) can conduct electricity between the first conducting layer 306 and the second conducting layer 308, thereby closing the electrical circuit 310. In this case, closing the electrical circuit 310 can activate an alarm system and/or a fire mitigation system (e.g., a sprinkler system). Once the fire is contained and the temperature of the material layer 304 drops below the defined threshold (e.g., the material layer 304 turns solid), then the thermal switch 302 can open the electrical circuit 310, thereby deactivating the alarm system and/or fire mitigation system.

As another non-limiting example, the thermal switch 302 can be installed on a vehicle in the form of a missile. The thermal switch 302 can be relatively thin sheets that are installed across the missile. If a fuel fire were to break out somewhere near the missile, the thermal switch 302 can detect changes in temperature within the missile based on the material layer 304 turning into liquid and closing the electrical circuit 310. As opposed to discrete switches that detect temperature changes at a discrete point, the thermal switch 302 described herein can potentially detect temperature over a relatively large area of the missile. Thus, it can be known when the temperature of a particular area on the missile has exceeded the defined threshold (e.g., due to a fuel fire).

Figure 4:
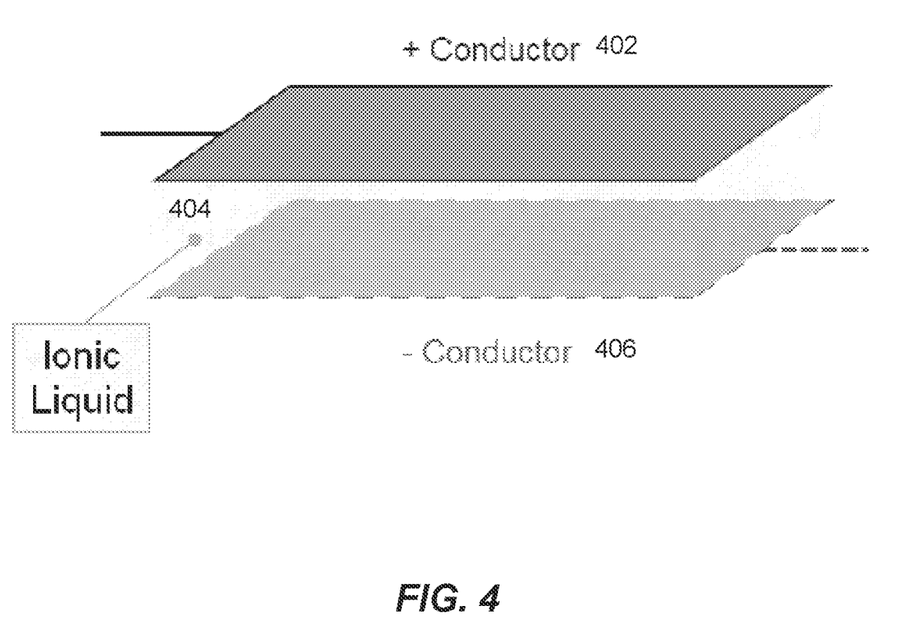
FIG. 4 illustrates a first conductor, a second conductor and an ionic liquid layer in a thermal switch in accordance with an example.

FIG. 4 illustrates a first conductor 402, a second conductor 406 and an ionic liquid layer 404 in a thermal switch. The ionic liquid layer 404 can be at a defined thickness and in between the first conductor 402 and the second conductor 406. In one example, the first conductor 402 can be a positive conductor and the second conductor 404 can be a negative conductor. Although the ionic liquid layer 404 is shown as an example in FIG. 4, the layer between the first conductor 402 and the second conductor 404 can be any appropriate layer that conducts electricity upon reaching a defined temperature level and does not conduct electricity when below the defined temperature level. When the ionic liquid layer 404 is conducting electricity, the first conductor 402 can be electrically connected to the second conductor 406. A flow of current can occur between the first conductor 402 and the second conductor 406, and as a result, the thermal switch can close an electrical circuit (not shown in FIG. 4). When current does not flow between the first conductor 402 and the second conductor 406, the thermal switch opens the electrical circuit.

Figure 5:
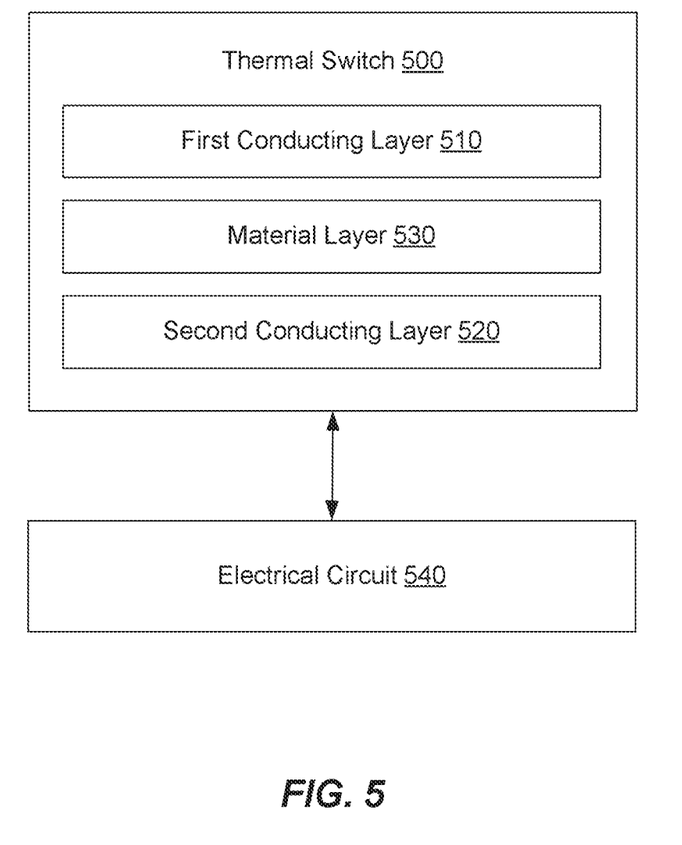
FIG. 5 illustrates a thermal switch in accordance with an example.

FIG. 5 is a block diagram of a thermal switch 500. The thermal switch 500 can comprise a first conducting layer 510; a second conducting layer 520; and a material layer 530 in between the first conducting layer 510 and the second conducting layer 520, wherein the material layer 530 is a conductor when above a defined temperature and a dielectric when below the defined temperature, wherein the thermal switch 500 is operable to close an electrical circuit 540 when the material layer 530 is the conductor and open the electrical circuit 540 when the material layer 530 is the dielectric.

In one example, an alarm system is activated when the electrical circuit 540 is closed; or the alarm system is deactivated when the electrical circuit 540 is open. In another example, a fire mitigation system is activated when the electrical circuit 540 is closed; or the fire mitigation system is deactivated when the electrical circuit 540 is open.

In one example, the material layer 530 comprises an ionic liquid. In another example, the material layer 530 is selected in accordance with a desired melting temperature. In yet another example, the thermal switch 500 is operable to facilitate fire detection. In addition, the material layer 530 is substantially solid when below the defined temperature and substantially liquid when above the defined temperature.

In one example, the first conducting layer 510 and the second conducting layer 520 include conducting wires or conducting plates. In another example, the thermal switch 500 covers a defined surface area and is operable to detect a rise in temperature of the defined surface area when a portion of the material layer 530 turns substantially into liquid. In yet another example, current can flow between the first conducting layer 510 and the second conducting layer 520 when the material layer 530 is the conductor, thereby closing the electrical circuit 540. In addition, the first conducting layer 510 is a positive conductor and the second conducting layer 520 is a negative conductor.

Figure 6:
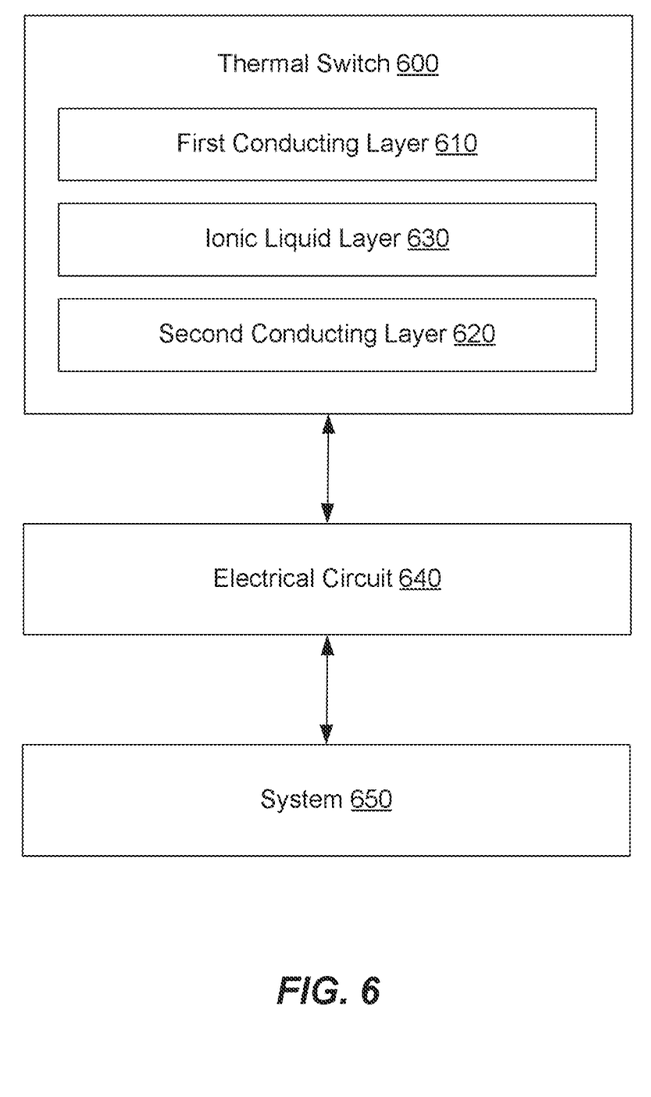
FIG. 6 illustrates a thermal switch for controlling an electrical circuit in accordance with an example.

FIG. 6 is a block diagram of a thermal switch 600 for controlling a system 650. The thermal switch 600 can comprise at least two conducting layers (e.g., a first conducting layer 610 and a second conducting layer 620); and an ionic liquid layer 630 in between the at least two conducting layers, wherein the ionic liquid layer 630 conducts electricity when heated above a defined temperature, thereby closing the electrical circuit 640 and activating a system 650.

In one example, the ionic liquid layer 630 is a dielectric when below the defined temperature, wherein the electrical circuit 640 is open when the ionic liquid layer 630 is the dielectric and the system 650 is deactivated. In another example, an alarm system or a temperature mitigation system is activated when the electrical circuit 640 is closed. In yet another example, the thermal switch 600 is onboard a vehicle (e.g., missile) or installed in a building. In addition, the ionic liquid layer 630 is selected in accordance with a desired melting temperature.

Figure 7:
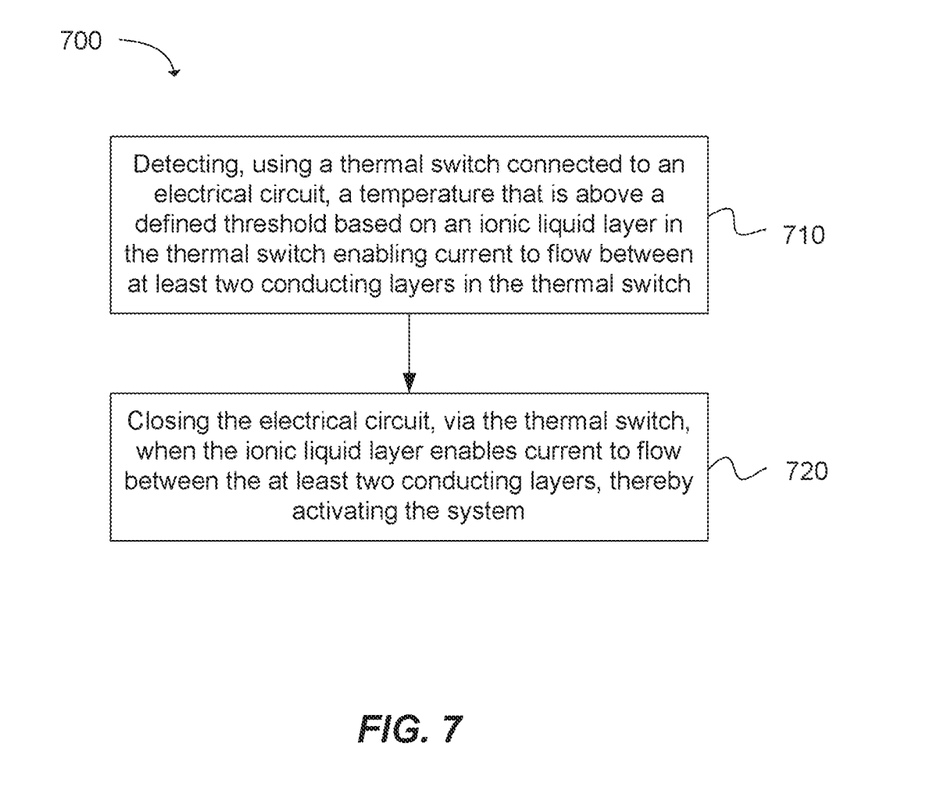
FIG. 7 depicts a flow chart of a method for activating a system based on temperature in accordance with an example.

FIG. 7 depicts a flow chart of a method for activating a system based on temperature. The method can be executed as instructions on a machine, where the instructions are included on at least one computer readable medium or one non-transitory machine readable storage medium. The method can be implemented using one or more processors of the machine. The method can include the operation of detecting, using a thermal switch connected to an electrical circuit, a temperature that is above a defined threshold based on an ionic liquid layer in the thermal switch enabling current to flow between at least two conducting layers in the thermal switch, as in block 710. The method can include the operation of closing the electrical circuit, via the thermal switch, when the ionic liquid layer enables current to flow between the at least two conducting layers, thereby activating the system, as in block 720.

In one example, the thermal switch includes the at least two conducting layers and the ionic liquid layer that is in between the at least two conducting layers. In another example, the method can further include the operation of opening the electrical circuit when the ionic liquid layer in the thermal switch restricts current from flowing between the at least two conducting layers in the thermal switch, wherein the current is restricted when the temperature of the ionic liquid layer is below the defined threshold; and deactivating the system when the electrical circuit is opened. In yet another example, the method can further include the operation of activating an alarm system or a temperature mitigation system on a vehicle (e.g., missile) or within a building when the electrical circuit is closed via the thermal switch.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A thermal switch, comprising:
   a first conducting layer;
   a second conducting layer; and
   a material layer in between the first conducting layer and the second conducting layer, wherein the material layer is a conductor when above a defined temperature and a dielectric when below the defined temperature, wherein the thermal switch is operable to close an electrical circuit when the material layer is the conductor and open the electrical circuit when the material layer is the dielectric.

2. The thermal switch of claim 1, further comprising an alarm system, wherein:
   the alarm system is activated when the electrical circuit is closed; or
   the alarm system is deactivated when the electrical circuit is open.

3. The thermal switch of claim 1, further comprising a fire mitigation system, wherein:
   the fire mitigation system is activated when the electrical circuit is closed; or
   the fire mitigation system is deactivated when the electrical circuit is open.

4. The thermal switch of claim 1, wherein the material layer comprises an ionic liquid.

5. The thermal switch of claim 1, wherein the material layer is selected in accordance with a desired melting temperature.

6. The thermal switch of claim 1, wherein the thermal switch is operable to facilitate fire detection.

7. The thermal switch of claim 1, wherein the material layer is substantially solid when below the defined temperature and substantially liquid when above the defined temperature.

8. The thermal switch of claim 1, wherein the first conducting layer and the second conducting layer include conducting wires or conducting plates.

9. The thermal switch of claim 1, wherein the thermal switch covers a defined surface area and is operable to detect a rise in temperature within the defined surface area when a portion of the material layer turns substantially into liquid.

10. The thermal switch of claim 1, wherein current flows between the first conducting layer and the second conducting layer when the material layer is the conductor, thereby closing the electrical circuit.

11. The thermal switch of claim 1, wherein the first conducting layer is a positive conductor and the second conducting layer is a negative conductor.

12. A thermal switch for controlling an electrical circuit, comprising:
    at least two conducting layers; and
    an ionic layer in between the at least two conducting layers, wherein the ionic liquid layer conducts electricity when heated above a defined temperature, thereby closing the electrical circuit and activating a system, wherein the thermal switch is operable to facilitate fire detection.

13. The thermal switch of claim 12, wherein the ionic layer is a dielectric when below the defined temperature, wherein the electrical circuit is open when the ionic layer is the dielectric and the system is deactivated.

14. The thermal switch of claim 12, wherein an alarm system or a temperature mitigation system is activated when the electrical circuit is closed.

15. The thermal switch of claim 12, wherein the thermal switch is onboard a vehicle or installed in a building.

16. The thermal switch of claim 12, wherein the ionic layer is selected in accordance with a desired melting temperature.

17. A method for activating a system based on temperature, the method comprising:
    detecting, using a thermal switch having an ionic layer connected to an electrical circuit, a temperature that is above a defined threshold based on a melting point of the ionic layer in the thermal switch enabling current to flow between at least two conducting layers in the thermal switch; and
    closing the electrical circuit, via the thermal switch, when the ionic layer is a liquid thus enabling current to flow between the at least two conducting layers, thereby activating the system.

18. The method of claim 17, wherein the thermal switch includes the at least two conducting layers and the ionic layer that is in between the at least two conducting layers.

19. The method of claim 17, further comprising:
    opening the electrical circuit when the ionic layer in the thermal switch restricts current from flowing between the at least two conducting layers in the thermal switch, wherein the current is restricted when the temperature of the ionic layer is below the defined threshold; and
    deactivating the system when the electrical circuit is opened.

20. The method of claim 17, further comprising activating an alarm system or a temperature mitigation system on a vehicle or within a building when the electrical circuit is closed via the thermal switch.

* * * * *